United States Patent
Leong et al.

(10) Patent No.: US 8,089,115 B2
(45) Date of Patent: Jan. 3, 2012

(54) ORGANIC MEMORY DEVICE WITH A CHARGE STORAGE LAYER AND METHOD OF MANUFACTURE

(75) Inventors: Wei Lin Leong, Singapore (SG); Pooi See Lee, Singapore (SG); Yeng Ming Lam, Singapore (SG); Lixin Song, Singapore (SG); Ebinazar Benjamin Namdas, Singapore (SG); G. Subodh Mhaisalkar, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 12/302,200

(22) PCT Filed: May 22, 2007

(86) PCT No.: PCT/SG2007/000141
§ 371 (c)(1),
(2), (4) Date: Nov. 24, 2008

(87) PCT Pub. No.: WO2007/136350
PCT Pub. Date: Nov. 29, 2007

(65) Prior Publication Data
US 2009/0146202 A1    Jun. 11, 2009

Related U.S. Application Data

(60) Provisional application No. 60/802,167, filed on May 22, 2006.

(51) Int. Cl.
*H01L 29/788* (2006.01)
(52) U.S. Cl. ........... 257/315; 257/40; 977/783; 977/943
(58) Field of Classification Search .................. 257/40, 257/315; 977/783, 943
See application file for complete search history.

(56) References Cited

U.S. PATENT DOCUMENTS

| | | | |
|---|---|---|---|
| 5,959,896 A * | 9/1999 | Forbes | 365/185.33 |
| 6,887,332 B1 | 5/2005 | Kagan et al. | |
| 6,930,322 B1 | 8/2005 | Mori | |
| 7,221,016 B2 * | 5/2007 | Inoue et al. | 257/315 |
| 7,355,238 B2 * | 4/2008 | Takata et al. | 257/314 |
| 7,585,564 B2 * | 9/2009 | Whiteford et al. | 428/402 |
| 2005/0017370 A1 | 1/2005 | Stasiak | |
| 2006/0131569 A1 | 6/2006 | Choi et al. | |

FOREIGN PATENT DOCUMENTS
WO   WO 2006/033794    3/2006

* cited by examiner

*Primary Examiner* — Howard Weiss
(74) *Attorney, Agent, or Firm* — Dickstein Shapiro LLP

(57) ABSTRACT

An organic memory device is disclosed that has an active layer, at least one charge storage layer of a film of an organic dielectric material, and nanostructures and/or nano-particles of a charge-storing material on or in the film of dielectric material. Each of the nanostructures and/or nano-particles is separated from the others of the nanostructures and/or nano-particles by the organic dielectric material of the organic dielectric film. A method of manufacturing the organic memory device is also disclosed.

14 Claims, 10 Drawing Sheets

ORGANIC MEMORY DEVICE WITH A CHARGE STORAGE LAYER AND METHOD OF MANUFACTURE

REFERENCE TO RELATED APPLICATION

Reference is made to our earlier U.S. provisional patent application No. 60/802,167 filed May 22, 2006 for an invention titled "Synthesis, Design and Method of Forming Nanoparticles based on organic Floating State Memory Devices" the priority of which is hereby claimed, and the contents of which are hereby incorporated by reference as if disclosed herein in their entirety.

TECHNICAL FIELD

This invention relates to an organic memory device and a method of its manufacture and refers particularly, though not exclusively, to a nanostructure-based organic floating gate memory and method of its manufacture employing chemical self-assembly and using nanostructures and/or nano-particles as charge storage components.

BACKGROUND

Research in organic electronics has been gaining increasing interest in recent years due to its potential in providing low-cost fabrication, compatibility with flexible substrates, amenable to small specialized production runs, suitability for large-area deposition and suitability for mass production. Organic memory offers very attractive alternative solutions in a number of niche applications of electronics where low cost and inclusion of different functionalities are desirable. Organic memories have a simple device design, offering the potential of uncomplicated integration and simple cell concepts with very small cell sizes. They are of low-cost since they are much simpler to manufacture than silicon chips and are easy to stack, packing bits at high density. Organic memories also have the extendibility to sensing, radio frequency identification (RFID) and passive or active matrix backplanes.

Under the three main streams of semiconductor memory technologies—Static Random Access Memory (SRAM), Dynamic Random Access Memory (DRAM) and Flash Memory, only the Flash memory shows non-volatile characteristics. But DRAM shows high density capabilities while SRAM has fast read/write performance. It would be advantageous to be able to combine the benefits of these three types of inorganic memories—non-volatility, high performance and high density. Organic memories offer the potential to exhibit such desired characteristics.

Although switching and memory phenomena in organic materials and devices have been reported for more than 30 years, high performance organic memory is still lacking. Three-terminal transistors, using ferroelectric polymers, and two-terminal bistable devices, which exploit charge transfer between metal atoms and organic compounds, exhibit interesting performance but are far from practical applications in memory.

A new electronic bi-stable device with a triple-layer structure consisting of two organic layers and a middle discontinuous metal layer, sandwiched between two metal electrodes, has been proposed. It exhibits promising performance and can be used as non-volatile memory. However, its fabrication is by thermal evaporation in a high vacuum, and stringent conditions are required to control the morphology of the middle, discontinuous metal layer. Additional addressing of the sandwich-type memory device and integration with other transistors is still needed. This will further increase the cost, making organic memories not cost-effective.

Floating-gate type transistor-based memory devices that utilize discrete traps as charge storage elements may be integrated as non-volatile memory in logic systems by leveraging on materials used in other silicon transistors and upon conventional silicon microelectronics know-how. The discrete charge storage elements utilized in such devices are usually isolated Si, Ge or metal nanocrystals.

Much research has been conducted on nanostructure or nano-particle formation using high temperature CMOS compatible processes. Organic memory devices which use organically passivated nanoparticles as charge storage elements can be deposited at room temperature using simple chemical self-assembly, Langmuir-Blodgett or spin-coating methods. Room temperature formation of nanostructures may find application in future 3-D organic memory architectures, compatible with the low temperature processable materials such as, for example, polymers.

Known organic memory devices involve the use of a multi-step approach of pre-synthesizing nano-particles that have a repulsive interaction so that agglomeration will not occur prior to embedding the particles in an organic layer. This is then followed by the various layers deposition process. This process is overly complex.

SUMMARY

According to a first exemplary embodiment there is provided an organic memory device comprising: an active layer; at least one charge storage layer comprising a film of an organic dielectric material, and nanostructures and/or nano-particles of a charge-storing material on or in the film of dielectric material, each of the nanostructures and/or nano-particles being separated from the others of the nanostructures and/or nano-particles by the organic dielectric material of the organic dielectric film.

The organic memory device may further comprise a tunneling layer on a first side of the at least one charge storage layer, and a control layer on a second side of the charge storage layer, the first side being opposite the second side. The control layer may be integral with the at least one charge storage layer. Additionally or alternatively, the tunneling layer may be integral with the at least one charge storage layer.

The film of organic dielectric material may comprise a self-assembled copolymer selected from the group consisting of: diblock, triblock, and multiblock. The film of organic dielectric material may comprise a self-assembled monolayer that may consist of silane derivatives. The nanostructures and/or nano-particles may have an affinity with the self-assembled copolymer or self-assembled monolayer.

According to another exemplary aspect there is provided a method for the fabrication of an organic memory device, the method comprising forming a control layer on a gate electrode, forming a charge storage layer including nanostructures and/or nano-particles on the control layer, forming a tunneling layer on the charge storage layer, and forming an active layer on the tunneling layer.

The control layer may be formed integrally with the charge storage layer. Additionally or alternatively, the tunneling layer may be formed integrally with the charge storage layer. The charge storage layer may comprise a self-assembled copolymer film and the nanostructures and/or nano-particles.

The nanostructures and/or nano-particles may be formed on the film by at least one of: spin-coating, screen-printing, and inkjet-printing.

The charge storage layer may include nanostructures and/or nano-particles prepared in a single solution for a self-assembled copolymer film and a precursor for the nanostructures and/or nano-particles. The method may further comprise performing a reduction in the single solution; and adjusting a viscosity of the solution for different deposition processes. The single solution may be cast on a thin oxide layer to form the charge storage layer.

The control layer and the tunneling layer may both comprise a self-assembled monolayer. The nanostructures and/or nano-particles may be formed between the two layers of self-assembled monolayer. The nanostructures and/or nano-particles may have an affinity to the self-assembled monolayers. The affinity may be physical and/or chemical. The nanostructures and/or nano-particles may be deposited on a first of the two layers of self-assembled monolayer and the other of the two layers of self-assembled monolayer may then be deposited on the nanostructures and/or nano-particles. The self-assembled copolymer may be: diblock, triblock, or multiblock.

For both exemplary aspects, each of the nanostructures and/or nano-particles may be electrically isolated. The charge storage layer may comprise a single layer. The nanostructures and/or nano-particles may be within the single layer. Alternatively, the charge storage layer may comprise two layers. The nanostructures and/or nano-particles may be formed between the two layers.

The self-assembled copolymer may be of a material consisting of: vinylene-based, methacrylate-based, and polyethylene oxide-based monomers.

The nanostructures and/or nano-particles may have an affinity with the self-assembled copolymer. The affinity may be at least one of: physical, and chemical. The nanostructures and/or nano-particles may be at least one of: metal, oxide of a metal, semiconductor, ceramic, semiconducting nano-particles, nanoclusters, nanorods, nanofibers, quantum dots, fullerene, and derivatives of fullerene. The quantum dots may be of: gold, silver, copper, titanium dioxide, zinc dioxide, cadmium selenides, and/or cadmium sulphides.

A charge storage capability may be able to be adjusted by adjusting a concentration of the nanostructures and/or nano-particles in the single solution.

The organic memory device may comprise a thin film transistor. The thin film transistor may further comprise a source electrode, a drain electrode, and a gate electrode. The active layer may comprise a semiconductor. The thin film transistor may further comprise a supporting substrate selected from: glass, plastic, quartz, metal foil, undoped silicon and heavily doped silicon.

The tunneling layer and control layer may comprise a floating gate dielectric. The floating gate dielectric may comprise: dielectrics, and/or a copolymer-based dielectric. The semiconductor may be at least one of: organic, inorganic, hybrids, and mixtures thereof. The floating gate dielectric may be a self-assembled monolayer. The self-assembled monolayer may comprise at least one silane derivative.

The film of organic dielectric material may comprise a self-assembled copolymer. The block copolymer film may be first processed using a simple solvent extraction method to remove any ionic impurities before the synthesis of the nanostructures is carried out in the film.

BRIEF DESCRIPTION OF THE DRAWINGS

In order that the invention may be fully understood and readily put into practical effect there shall now be described by way of non-limitative example only exemplary embodiments of the present invention, the description being with reference to the accompanying illustrative drawings.

In the drawings.

DETAILED DESCRIPTION OF THE EXEMPLARY EMBODIMENTS

Figure 1:
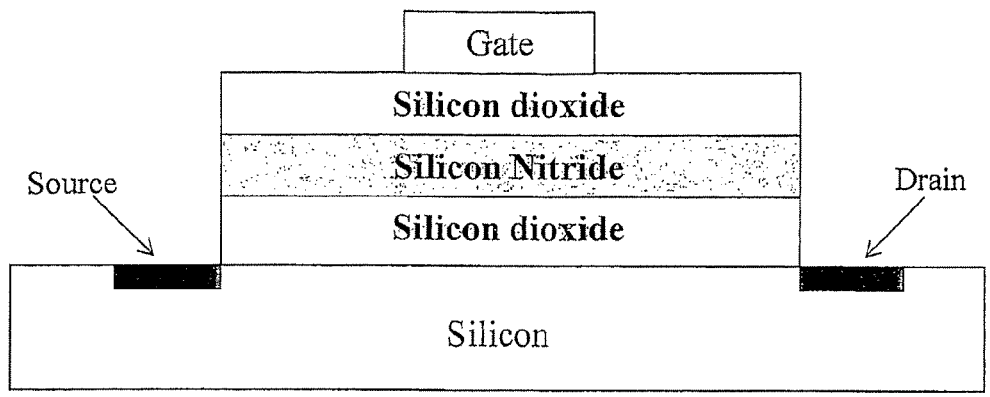
FIG. 1 is an illustration of a conventional ONO design.

As shown in FIG. 1, present memory devices are based on silicon oxide-silicon nitride-silicon oxide (ONO) where the nitride layer is the charge storage layer. One of the oxide layers acts as the tunneling oxide and the other acts as the control oxide. The nitride layer can be replaced by a nanostructured film. The charge build up occurs in the nanostructures.

Figure 2:
FIG. 2 is an image of a thin film of gold nano-particles embedded in polystyrene-poly(4-vinyl pyridine) ("PS-P4VP")
Figure 3:
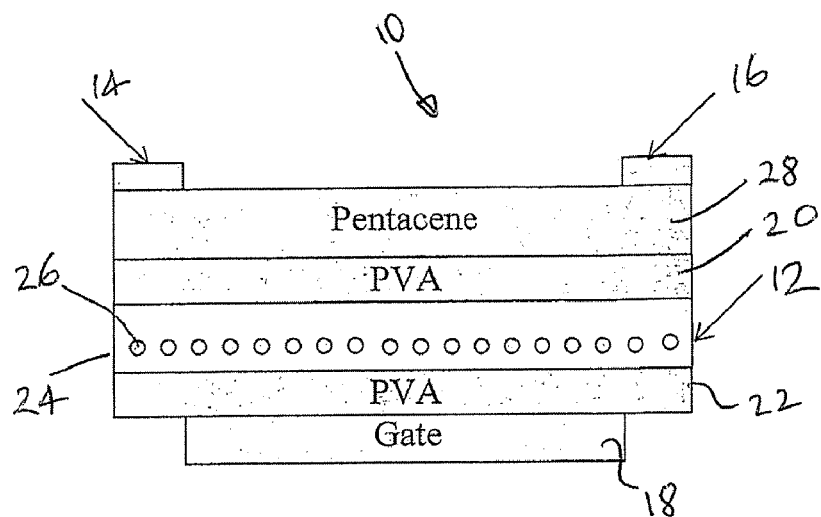
FIG. 3 is an illustration of an exemplary organic memory device with the self-assembled charge storage layer between organic control and tunneling layers.

As shown in FIGS. 2 and 3, and according to an exemplary embodiment, there is provided a charge storage film 12 for use in an organic memory device 10 and which has therein nanostructures and/or nano-particles 26. The charge storage film 12 may be, for example, a self-assembled block of a copolymer film such as, for example, PS-P4VP which has therein the nanostructures and/or nano-particles. The self-assembled block copolymers may be linear macromolecules that consist of different blocks (often incompatible) of different types of monomers. These self-assembled block copolymers can be diblock, triblock or multiblock and may be vinylene-based, methacrylate-based, and/or polyethylene oxide-based monomers.

Figure 6:
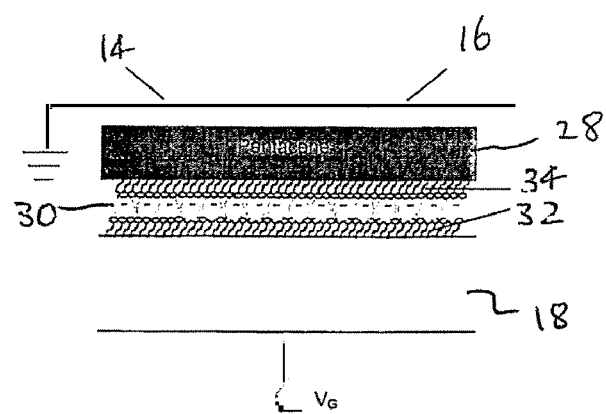
FIG. 6 is an illustration of an exemplary self-assembled monolayer design.

As shown in FIG. 6, the self-assembled organic film 24 may be self-assembled monolayers. Self-assembled monolayers are the spontaneous organization of molecules, molecular clusters, and aggregate structures into two-dimensional arrays and three-dimensional networks by attractive forces or chemical bond formation. Self-assembled monolayers may be silane derivative molecules.

The nanostructures and/or nano-particles 30 may have a physical and/or chemical affinity to the self-assembled monolayers 32.

The nanostructures and/or nano-particles 26 may be embedded in any vinylene-based, methacrylate-based, or polyethylene oxide-based block copolymers that are capable of self-assembly and provide a phase for the reduction of the precursor to nanostructures and/or nano-particles 26.

The self-assembled organic films 24 may include nanostructures and/or nano-particles 26/30 of metal, ceramic, semiconducting nano-particles, nanoclusters, nanorods, nanofibers, quantum dots such as, but not limited to, gold, silver, copper, titanium dioxide, zinc dioxide, cadmium selenides, cadmium sulphides, fullerene, and fullerene derivatives. The nanostructures and/or nano-particles 26/30 should not be in contact with each other. This means that there can be many charge storage centres and these centres will not short. The nanostructures and/or nano-particles 26/30 used in block copolymers or self-assembled monolayers may be of any metal, oxide, or semiconductor that has potential to store charges. The charge storage capability can be adjusted by the concentration of the nanostructures in block copolymer film 12 or on the self-assembled monolayers 32.

The device 10 may be a thin film transistor and may have a supporting substrate of glass, plastic, quartz, metal foil, undoped silicon or heavily doped silicon. The device may also include a semiconductor layer that is organic, inorganic, hybrids, or mixtures thereof.

The device 10 is shown in FIG. 3 and has a source 14, drain 16 and gate 18. The tunneling layer 20 and the control layer 22 are both dielectrics and may be formed of an inorganic, organic or plastics dielectric material such as, for example, a polymeric dielectric material such as polyvinyl alcohol ("PVA") or any other polymeric material with a reasonable dielectric constant. The charge storage layer 24 consists of the charge storage film 12 that has electrically isolated nanostructures and/or nano-particles 26. This means that there can be many charge storage centers and these centers will not short due to them being separated by the copolymer film 12. An active layer 28 is used and to which the source 14 and drain 16 electrodes are connected. The active layer 28 is preferably of an organic semiconductor such as, for example, pentacene or polythiophene. The active layer 28 may also act as a supporting substrate.

Figure 4:
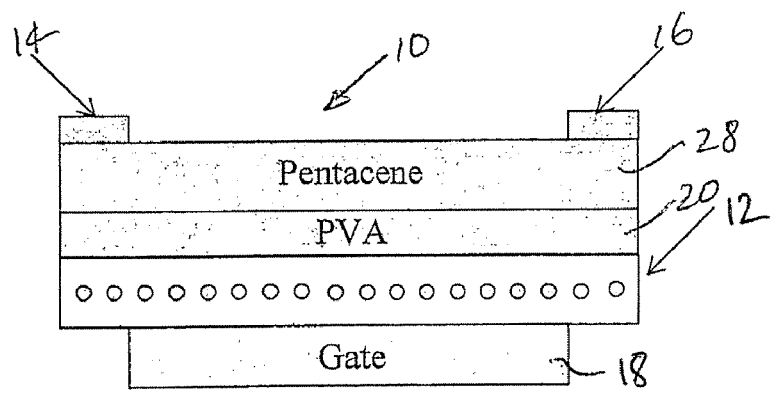
FIG. 4 is an illustration of an exemplary organic memory device with the self-assembled layer acting as both the charge storage layer and the control layer, the tunneling layer being of a different polymeric material.

As shown in FIG. 4, the device 10 may have the self-assembled charge storage film 12 with nanostructures and/or nano-particles 26 acting as both the charge storage layer 24 as well as the control layer 22. Alternatively, the self-assembled charge storage film 12 with nanostructures and/or nano-particles 26 can act as both the charge storage layer 24 as well as the tunneling layer 22.

Figure 5:
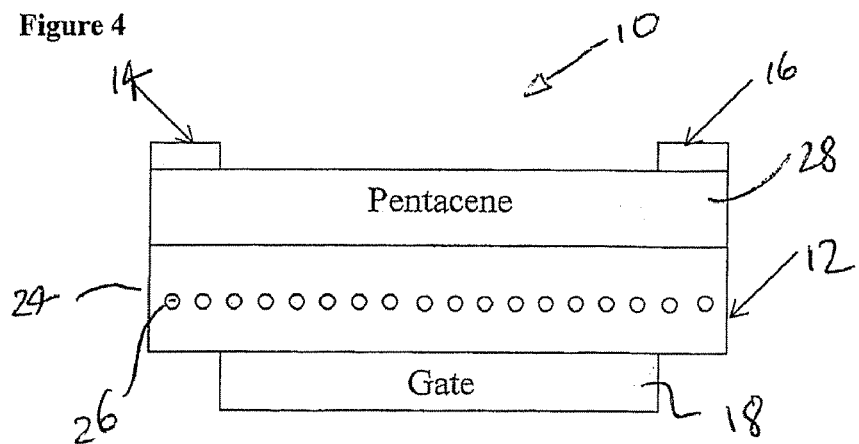
FIG. 5 is an illustration of an exemplary organic memory device with the self-assembled layer acting as the charge storage, the tunneling layer and the control layer.

In FIG. 5 the self-assembled charge storage film 12 is acting as the charge storage, the control layer 22 as well as the tunneling layer 20.

The charge storage film 24 may be made using one of two different self-assembly methods each of which are able to be used with plastic substrates at temperatures below 100° C.

In the first method the charge storage film 24 is a self-assembled copolymer film with in-situ synthesized nanostructures and/or nano-particles that may be, for example, spin-coated, screen-printed and/or inkjet-printed onto the film. A single solution may be prepared with both the copolymer thin film and the nanoparticle precursor. Reduction may also be carried out in the solution. The viscosity of the solution may be adjusted for different deposition processes. This provides nano-particles that do not aggregate together and negates the need for the nano-particles to be soluble in the polymer film. This is useable for nanostructures and/or nano-particles of any suitable material such as, for example, gold, silver, aluminum, cobalt, iron-cobalt alloy, and so forth. By using this method, a one step preparation, mixing and deposition process can be used to prepare the organic charge storing layer 24. The charge storage layer 24 may be manufactured with the control layer 22 and/or tunneling layer 20 in a one step process.

An organic thin-film transistor ("OTFT")-based memory device fabrication process uses a self-assembled copolymer composite film as a floating gate dielectric layer for memory applications by in-situ synthesis of nanostructures and/or nano-particles embedded in the self-assembled copolymer composite film. In an exemplary embodiment:

The control layer 22 of a material such as, for example, polyvinyl alcohol, is spin coated on the gate electrode 18. The gate electrode 18 is of any suitable material such as, for example, gold.

The memory layer 24 consisting of the nanostructures and/or nano-particles is then spin coated on the control layer 22.

The tunneling layer 20 of a material such as, for example, polyvinyl alcohol, is then spin coated on the memory layer 24.

The active layer 28 of an organic semiconductor such as, for example, pentacene or polythiophene is applied to the tunneling layer 20 by one or more of: thermal evaporation, spin-coating, and being printed.

The source 14 and drain 16 are then generated by using patterning.

The second method is illustrated in FIG. 6. Here, nanostructures 30 are manufactured that are held by layers 32 and 34 of self-assembled monolayers ("SAM"s). In one exemplary form of the method, the oxide layers of FIG. 1 are replaced by layers 32 and 34 of the self-assembled monolayer. The nanostructures 30 have an affinity to the self-assembled monolayers 32, 34 and are deposited on the first layer 32. The other layer 34 of self-assembled monolayer is then deposited on the nanostructures 30. The active region 28 is then applied. If required or desired, layer 34 may be deleted.

Figure 7:
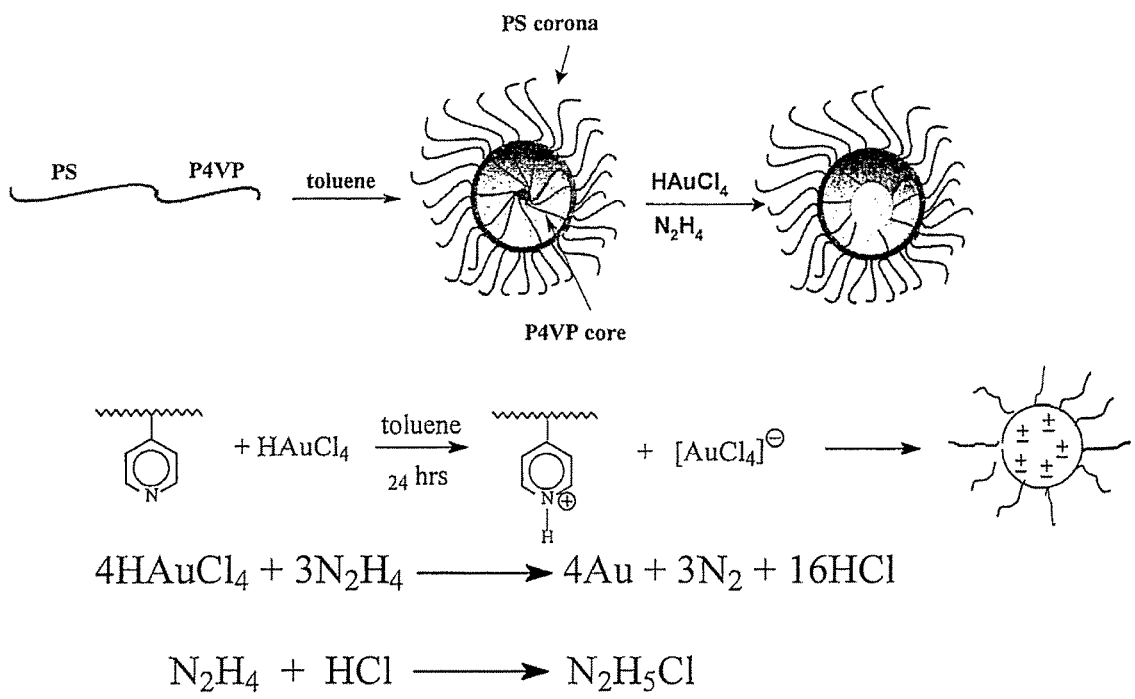
FIG. 7 is an illustration of an exemplary reaction scheme for reduction of gold in PS-P4VP.

FIG. 7 shows the reduction scheme for the synthesis of a self-assembled copolymer composite film as a floating gate dielectric layer for memory applications. Nano-particles are synthesized in-situ in copolymeric solution and the film is then deposited as the active layer in an organic memory device. The nanoparticle precursors are incorporated in the copolymer solution and the reduction of the precursor to nanoparticles is carried out in the solution. Following that, the film is cast on a thin oxide layer to form the active layer for one of:
- charge storage,
- both charge storage and control dielectric, or
- charge storage and both the control and tunneling dielectric.

This method of preparing the active layer reduces the need to modify the surface of the nano-particles prior to mixing with the polymer so the particles will not aggregate together. Aggregation of the particles could result in shorting between the particles. The organic memory device will be highly flexible and shorting of nano-particles should not occur, even when bent. This method can be performed at temperatures below 100° C.

The exemplary method for the in-situ synthesis of the self-assembled copolymer film comprises:

Polystyrene-Poly(4-vinyl pyridine) (PS-P4VP) diblock copolymer was first dissolved in toluene and a solvent extraction process is implanted to remove any ionic impurities. This is done by washing the PS-P4VP solution in water. The water phase is then removed and the toluene phase containing the PS-P4VP can now be precipitated from Hexane. The PS-P4VP is re-dissolved in toluene (concentration being in the range of 1-10 mg/mL, preferably being 5 mg/mL)

A stoichiometric equivalent of tetrachloroauric acid was added to the micellar solution with the ratio $HAuCl_4$:4-VP being in the range of 1:20 to 1:1, preferably being 1:5. Protonation of the 4-VP units resulted in the formation of a poly-ionic block.

The solution was then treated with hydrazine monohydrate. Because of its polar character, in the core of the micelles the hydrazine is preferentially taken up where it reduces $Au^{3+}$ to $Au^0$. The excess of hydrazine (if any) was removed directly after reduction by adding aqueous hydrochloric acid.

Neutralization of the excess hydrazine and precipitation of $N_2H_5Cl$ assists in the long-term stability of the colloidal dispersion. The precipitated hydrazinium chloride was removed by centrifuging.

The copolymer solution comprising the charge storage layer 24, a control layer 22 and the tunneling layer 20, may be applied to a p-type silicon substrate (as gate 18) by spin coating at a speed in the range 500 to 600 rpm, preferably 2000 rpm for a period of time on the range 10 to 120 seconds, preferably 60 seconds. After spin-coating, the copolymer film may be annealed at the range of 100-200° C., preferably at 150° C. in a vacuum. The annealing time is in the range of 30 minutes to 72 hours, preferably for 72 hours. After the deposition of copolymer film which comprise the nanostructures and/or nanoparticles 26 of gold, the active layer 28, source 14 and drain 16 were formed by subsequent thermal evaporation. FIG. 3 is a schematic illustration of the device structure.

Figure 8:
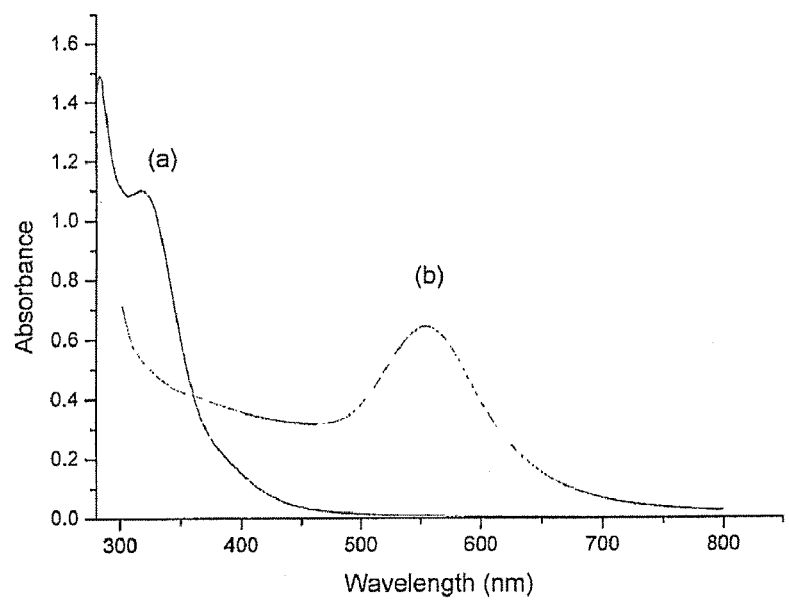
FIG. 8 is a graph of absorbance of the $PyH^+ AuCl_4^-$ ions.

As shown in FIG. 8, there is a shift in the absorption spectrum with the reduction of the Au precursor. The absorbance (curve a) of the $PyH^+ AuCl_4^-$ ions vanished almost instantaneously. The absorption band at 525 nm is characteristic of the surface plasmon resonance of the small Au nanocrystals that appear (curve b).

A metal-insulator-semiconductor ("MIS") heterostructure after annealing was fabricated to investigate the charging effect. A p-type silicon substrate is used with a thermally grown 1.4 nm silicon dioxide on top. The block copolymer is spin-coated on top, followed by deposition of the top gold electrode by thermal evaporation through a shadow mask of 300 μm diameter size. The annealing temperature for the copolymer film used is above the glass transition temperature of the block copolymer (110-150° C.) for at least 30 minutes.

Figure 9:
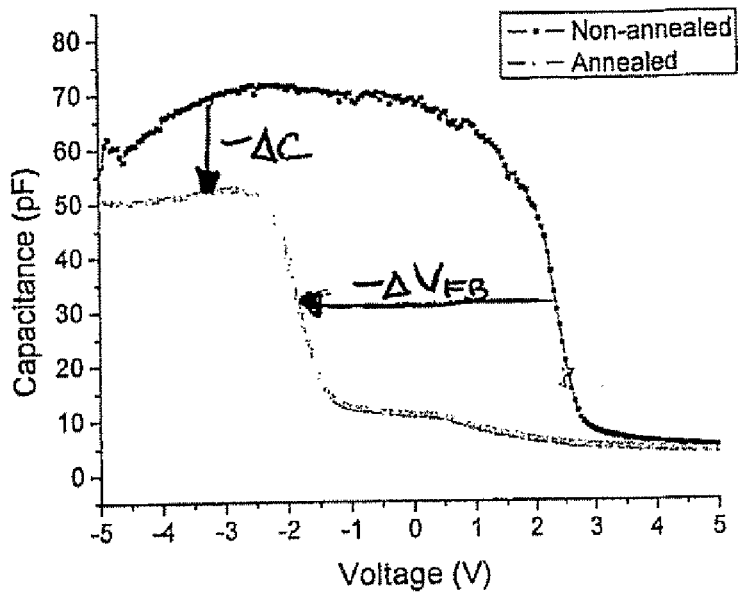
FIG. 9 is an illustration of capacitance vs voltage of Metal/PS-P4VP/1.4 nm $SiO_2$/Si substrate before and after annealing at 150° C. for 30 mins, the gate voltage being swept from −5V to +5V.

The capacitance-voltage (C-V) measurements were obtained using an HP 4284A Precision LCR Meter at a frequency ranging from 1 kH to 1 MHz. FIG. 9 shows the C-V measurements at a frequency of 1 MHz. An amplitude of 15 mV was superimposed on the DC bias. All experiments were carried out at room temperature and in ambient environment.

There is a negative flat-band voltage shift ($\Delta V_{FB}$) after annealing of the copolymer film. This indicates that there is less electron trapping in the annealed film. Hence, there is a possibility of reducing the defects, and charge trapping sites, in the copolymer film by the annealing process. The decrease in capacitance in the accumulation takes place as the process of annealing has reduced the number of charge-trapping sites and thus the tunneling path through the charge-trapping sites will be limited. Hence, the total capacitance decreases. The polar portion of the micelle (P4VP core) will contract upon annealing. With the smaller extension of the polar portion, there will be reduction of charge density (i.e. weaker electrostatic repulsions) around the P4VP core. This will mean a smaller hysteresis loop (fewer electrons or holes will be induced in the MIS structure) or shift in the flat-band voltage. But it is also possible that the difference in capacitance in the accumulation regime between the non-annealed and annealed samples is due to the difference in the dielectric constants of the non-annealed and annealed copolymer.

Figure 10:
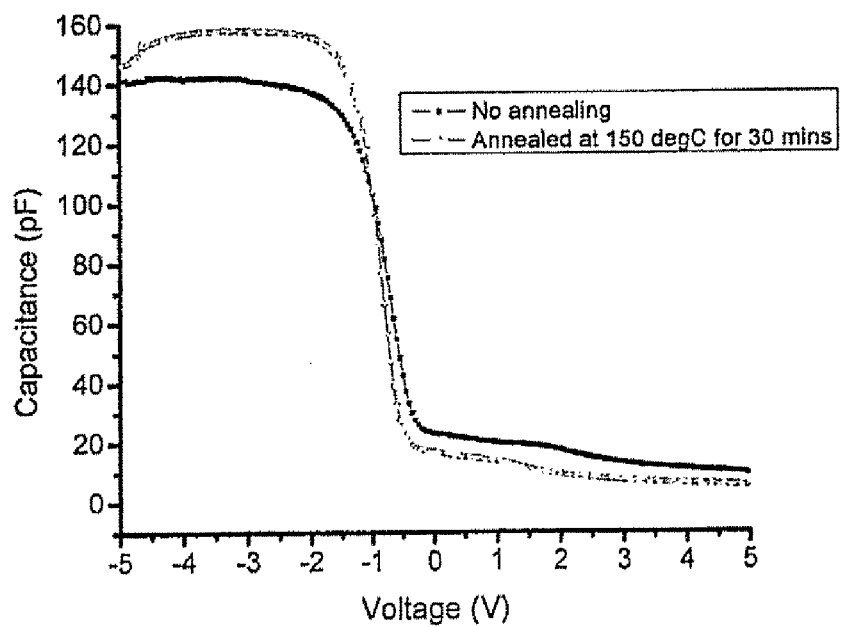
FIG. 10 is an illustration of capacitance vs voltage of Metal/PS-P4VP-Au/1.4 nm SiO2)/Si substrate before and after annealing at 150° C. for 30 mins, the gate voltage being sweep from −5V to +5V.

The stability of the micelles is enhanced upon the loading of Au nanoparticles, since the polar portion is converted to an ionomer block. The result of this is shown in FIG. 10, where there is little or negligible flat-band voltage change for PS-P4VP-Au before and after annealing.

Figure 11:
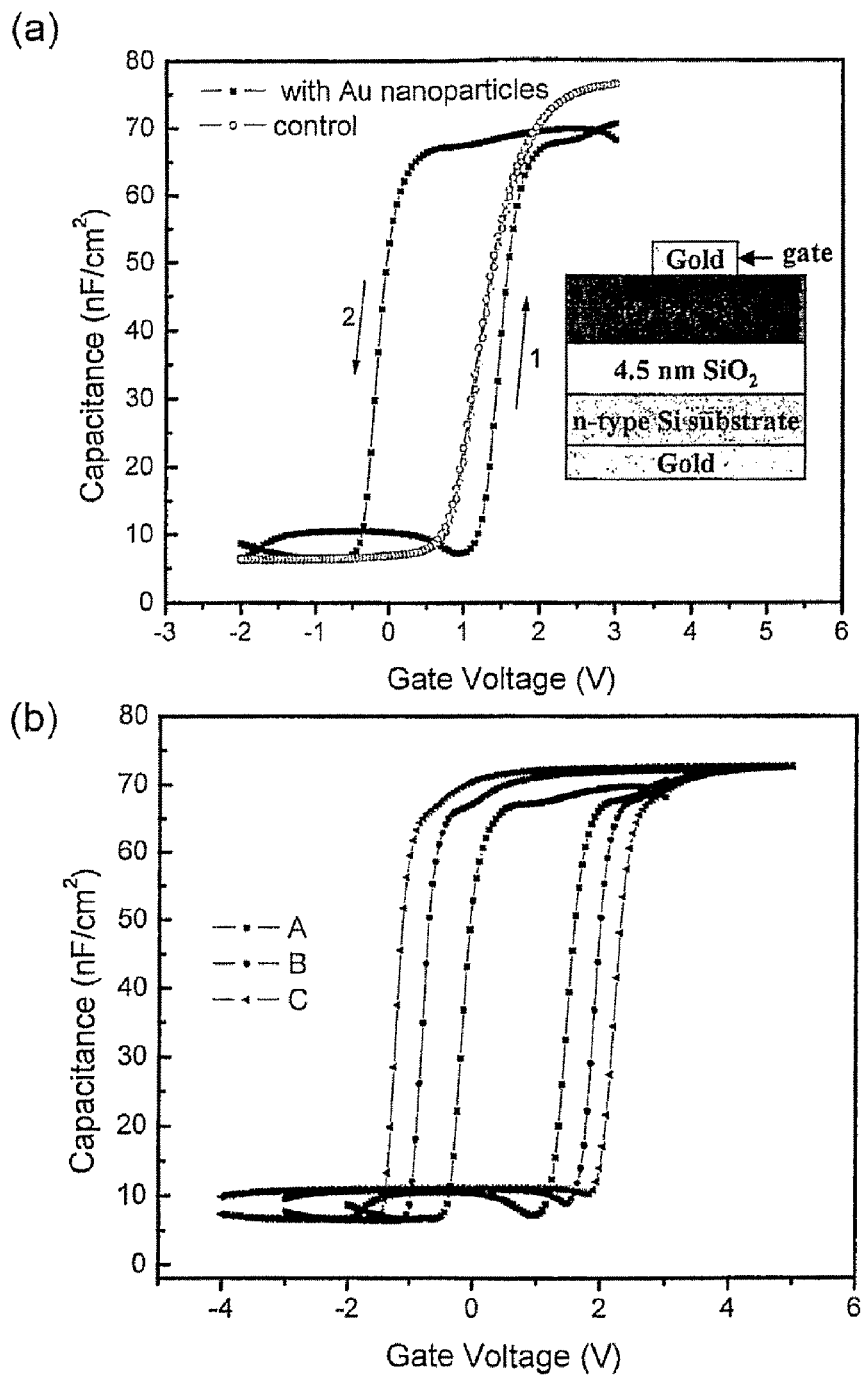
FIG. 11 is two illustrations of capacitance vs voltage for: (a) Metal/PS-P4VP/4.5 nm $SiO_2$/Si substrate, and Metal/PS-P4VP/4.5 nm $SiO_2$/Si substrate; (b) C-V curves of MIS structure with Au nanoparticles at 100 kHz for different gate bias sweeps. The start/stop gate voltage is (A) −2V/+3V, (B) −3V/+4V and (C) −4V/+5V. The hysteresis window for (A) is 1.66V, (B) is 2.75V and (C) is 3.45V.

FIG. 11 (a) shows the capacitance-voltage of the MIS structure using PS-P4VP as the dielectric layer at 100 kHz on MIS structures with and without Au nano-particles. The MIS structure is using a n-type silicon substrate with a 4.5 nm silicon dioxide on top. The active layer is then spin-coated on top, followed by deposition of the top gold electrode by thermal evaporation through a shadow mask of 300 μm diameter size. For the curve without Au nano-particles, there is negligible hysteresis observed indicating absence of trapped charges in the fabricated structure. The hysteresis is defined to be the flat band voltage shift.

FIG. 11 (b) shows the capacitance-voltage curves of the MIS structure with Au nano-particles at 100 kHz for different gate bias sweeps. The start/stop gate voltage is (A) −2V/+3V, (B) −3V/+4V and (C) −4V/+5V. The hysteresis window for (A) is 1.66V, (B) is 2.75V and (C) is 3.45V.

An anticlockwise hysteresis window in a range of 0.4 to 3.45V is observed for the sample with Au nanoparticles, depending on the range of operating voltage used, indicating a net hole trapping effect. The higher the operating voltage, the bigger is the hysteresis window. At the influence of negative gate voltage (applied from top metal electrode), holes may be injected from the substrate inversion layer and may be stored in the Au nanoparticles by a direct tunneling process through the ultra thin oxide. When the voltage is swept to positive value, the stored holes in the Au nanoparticles will be flushed out, resulting in the shift in capacitance characteristics.

A higher concentration of Au nanoparticles in the self-assembled copolymer film may result in a better charge storage capability. Hence the concentration of noble particles may control the charge storage ability of the organic memory.

Another exemplary process for the fabrication of OTFT-based memory devices with self-assembled monolayers and nanostructures as a floating gate dielectric layer may be implemented by:

Depositing a self-assembled monolayer 32 on a substrate.

Depositing nanostructures 30 with an affinity to the self-assembled monolayer 32 on the self-assembled monolayer 32.

Depositing another layer of the self-assembled monolayer 34 on the nanostructures 30.

The organic semiconductor layer 28, such as pentacene or polythiophene, is applied to the other layer 34 of the self-assembled monolayer by at least one of: thermal evaporation, spin-coating, and being printed on the self-assembled monolayer.

The source 14 and drain 16 for the organic memory is then deposited on the semiconductor layer 28.

The synthesis of gold nano-particles may be carried out by the use of a modified Turkevich method which used trisodium citrate ($Na_3C_6H_5O_7.2H_2O$) as the stabilising agent and sodium borohydride ($NaBH_4$) as the reducing agent. In an exemplary form, 0.5 ml of 0.01M hydrogen tetrachloroaurate (III) ($HAuCl_4.3H_2O$) was mixed with 0.5 ml of 0.01M trisodium citrate. The mole ratio of $HAuCl_4.3H_2O$ to $Na_3C_6H_5O_7.2H_2O$ was 1:1. The solution was diluted with 18 ml of deionised water and stirred. 0.5 ml of 0.1M $NaBH_4$ aqueous solution was added drop-by-drop and the solution was stirred for 30 seconds. The solution was left undisturbed for two hours.

Figure 12:
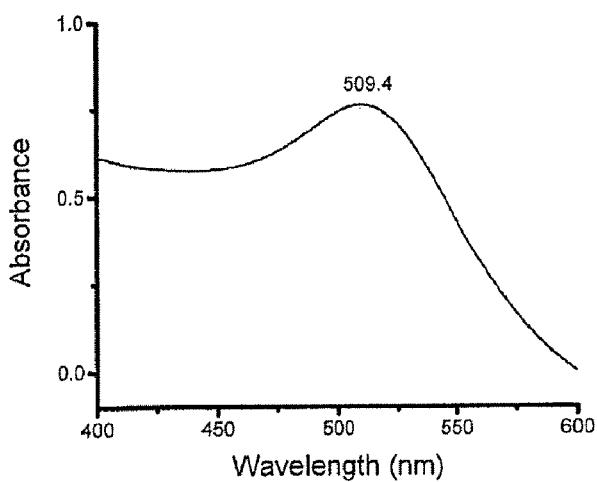
FIG. 12 is an illustration of absorbance vs wavelength of Au nano-particles.
Figure 13:
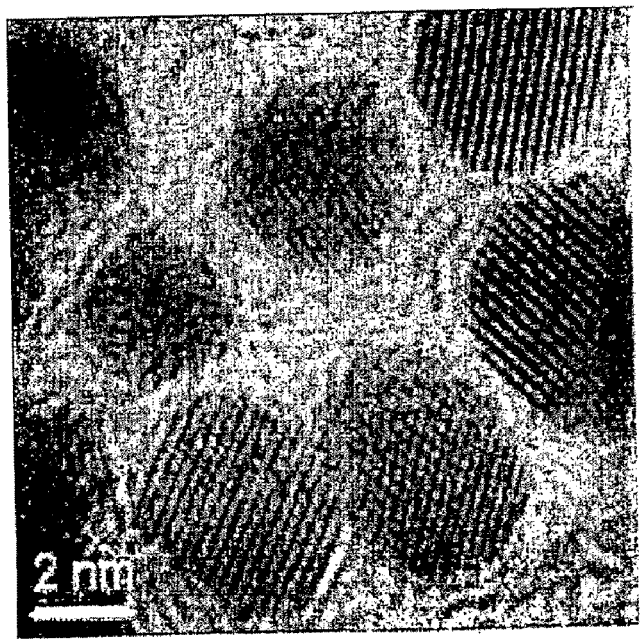
FIG. 13: a TEM image of 3-5 nm synthesized Au nano-particles.

As shown in FIG. 12, the Au nano-particles were characterized using UV-Vis and showed a peak at approximately 509.4 nm due to the presence of spherical Au nanoparticles, produced by the reduction of $HAuCl_4$ using sodium borohydride as the reducing agent. The size of the Au nanoparticles can be determined from the TEM image of FIG. 13. Droplets of the gold colloids were dropped onto a copper grid with holey carbon film and dried in vacuum. FIG. 13 shows monodispersed Au nano-particles of approximately 3-5 nm in diameter.

For the removal of possible organic contaminants from the substrate as well as the glassware used for solution deposition, piranha solution (2:1 concentrated $H_2SO_4$:30% $H_2O_2$) was employed, followed by RCA clean ($HCl:H_2O_2:H_2O$=1:1:10 and $NH_4OH:H_2O_2:H_2O$=1:1:5). After the RCA clean, the silicon substrate surface is rich in hydroxyl groups, which are used to link the 3-aminopropyl-triethoxysilane ("APTES") molecules. The amino-terminating APTES self-assembled monolayer was formed on a silicon surface by immersing the silicon substrate in 5-10% volume of APTES in absolute ethanol for 1-2 hour. The modified substrate was then rinsed successively in ethanol and deionized water to remove any loosely bound molecules and blow dried with nitrogen gas. Finally, the substrates were baked in vacuum oven at 120° C. for 30-60 minutes to complete the Si—O bond formation.

A monolayer of amino-substituted silane on the silicon was confirmed by ellipsometry, which revealed a film thickness of 0.9 nm. The thickness of the $SiO_2$ layer was measured separately on an unmodified substrate first and subtracted from the total layer thickness determined for the APTES monolayer-covered $SiO_2$/Si substrate. The difference in thickness yields the thickness of the APTES layer.

Figure 14:
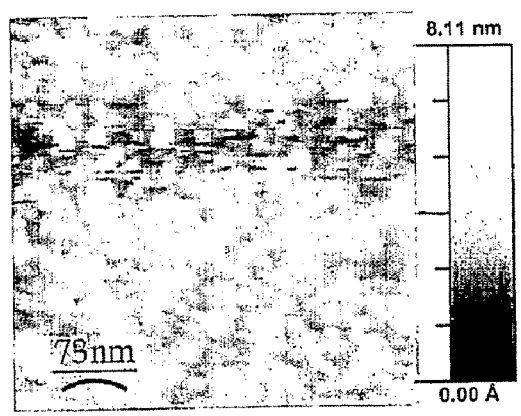
FIG. 14 is an AFM image of Au nano-particles deposited on an APTES-modified substrate.

The gold nano-particles were assembled on the amino-terminated silicon substrate surface by immersing the substrates into a colloidal solution of gold nano-particles for 6-12 hours. The pH of the gold colloid solution was adjusted to around 5-6. Since the solution of the gold nano-particles was slightly acidic, adding this solution to the amino-silylated substrates led to the protonation of the amino groups on the surface. Such positively charged substrate surfaces enabled electrostatic attraction of negatively charged citrate-stabilized gold nanoparticles. The substrates were removed from the solution, rinsed with deionised water and blow dried with nitrogen gas. The AFM image of FIG. 14 shows a densely-packed layer of gold nano-particles.

Figure 15:
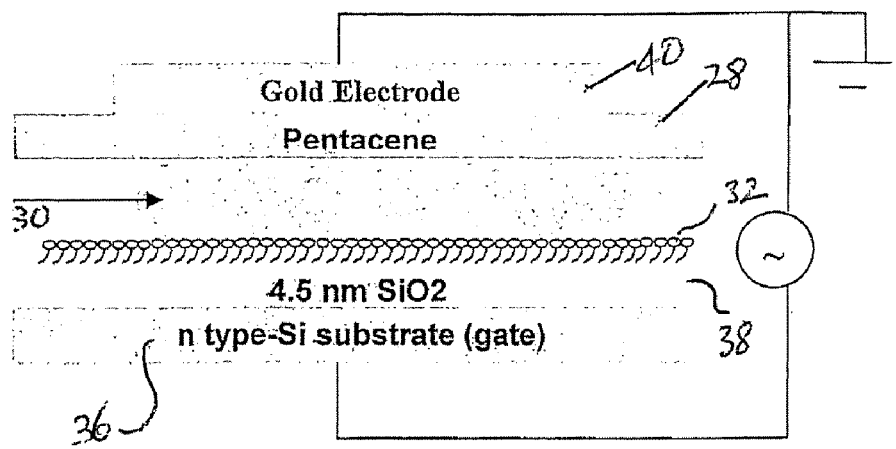
FIG. 15 is an illustration of an exemplary MPIS structure.

A metal-pentacene-insulator-silicon ("MPIS") structure is shown in FIG. 15, where pentacene is the active semiconductor layer 28. The n-type silicon substrate 36 is used as the gate electrode 18, with 4.5-nm thermally grown silicon dioxide 38 above it. The gold nano-particle layer 30 was deposited on the $SiO_2$ layer 38 at room temperature and pressure by chemical self-assembly. The pentacene layer 28 is thermally evaporated, at a deposition rate between 0.1-0.5 nm/s and a pressure of around $10^{-6}$-$10^{-7}$ torr, to form a 45±5-nm-thick film. The top metal electrode 40 of gold was subsequently deposited by thermal evaporation through a shadow mask of 300 μm diameter size.

The capacitance-voltage measurements were at a frequency range of 1 kHz-1 MHz and an amplitude of 15 mV was superimposed on the DC bias. All measurements were carried out at room temperature and in vacuum environment (~$10^{-3}$-$10^{-4}$ torr).

Figure 16:
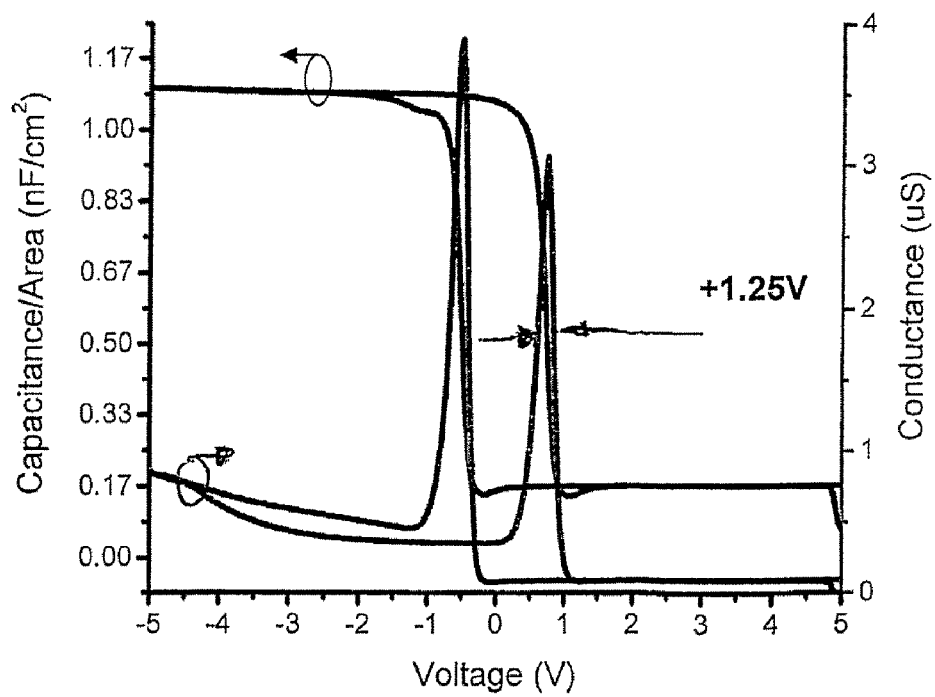
FIG. 16 is a graph of capacitance and conductance vs voltage of a metal/pentacene/Au nano-particles/APTES-modified substrate obtained by sweeping the gate voltage between +5V and −5V.
Figure 17:
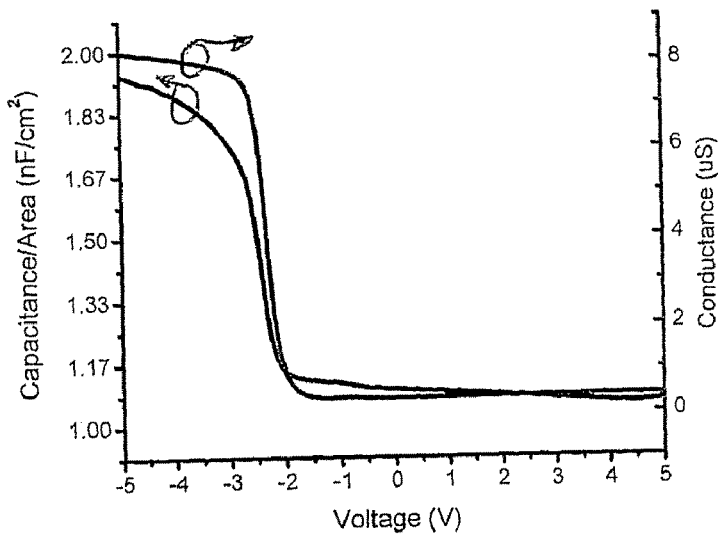
FIG. 17 is a graph of capacitance and conductance vs voltage of a metal/Pentacene/APTES modified substrate obtained by sweeping the gate voltage between +5V and −5V.

FIG. 16 shows the capacitance-voltage and conductance-voltage characteristics (frequency of 100 kHz is used) of the MPIS structure with deposited gold nanoparticles, where the conductance peak corresponds to the flat-band voltage. The conductance peak may be associated with energy loss due to the capture and emission of electrons by the gold nano-particles or the pentacene/gold nano-particle interface; but not to the pentacene/APTES interface states. This is from a comparison with the observation of the control sample without gold nano-particles of FIG. 17 as it has no conductance peak.

As shown in FIG. 16, a clockwise hysteresis window of 1.25V occurs upon double sweeping. This indicates a net hole trapping. Under the influence of a negative gate voltage, holes can be injected into the gold nano-particles from the pentacene accumulation layer. Most of the holes that are injected into the conduction band of the gold nano-particles are collected by the gate or the substrate, leading to a gate current or a substrate current, respectively. Upon applying a positive gate voltage, the stored charges in the gold nanoparticles are forced out, resulting in flat-band voltage shift. Both the magnitude of hysteresis in capacitance-voltage and the shift in the peak positions in conductance-voltage are about 1.25V. The single conductance peak observed in two directions means that only single-electron or single-hole trapping and de-trapping events were observed. As such the peak in conductance around the flat band condition indicates that a trap event had occurred where an electron or hole is stored per gold nano-particle. Therefore, these hysteresis and peak shifts may be attributed to holes trapped in the sandwiched gold nano-particles or at the interface of the gold nano-particles. States at the APTES or at the APTES-oxide interface may not be responsible for such behavior.

Figure 18:
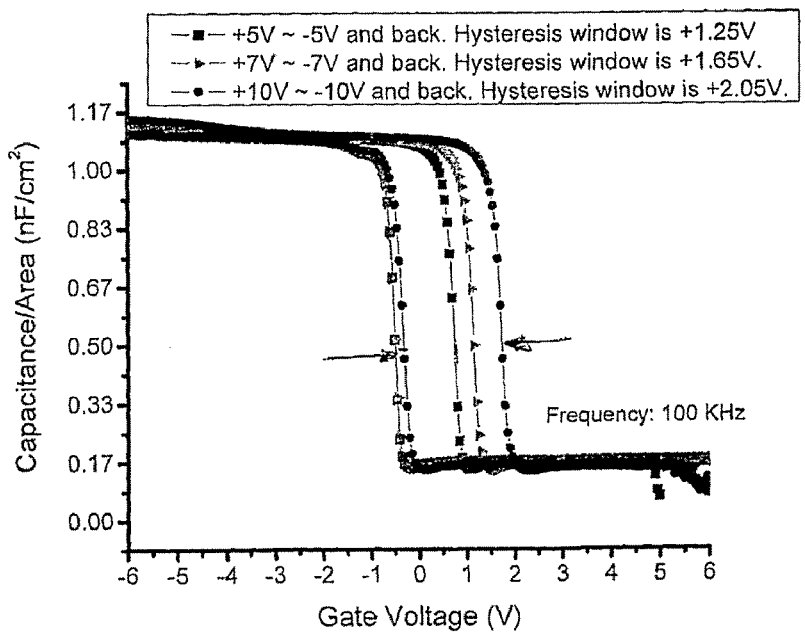
FIG. 18 is a graph of capacitance and conductance vs voltage of metal/pentacene/Au nano-particles/APTES-modified at 100 KHz for different gate bias sweep ranges.

FIG. 18 shows that the increment of the maximum operation bias from 5V to 10V increases the hysteresis window of the C-V curve from 1.25 V to 2.05V. This indicates that more and more holes are being trapped by increasing the gate voltage.

Figure 19:
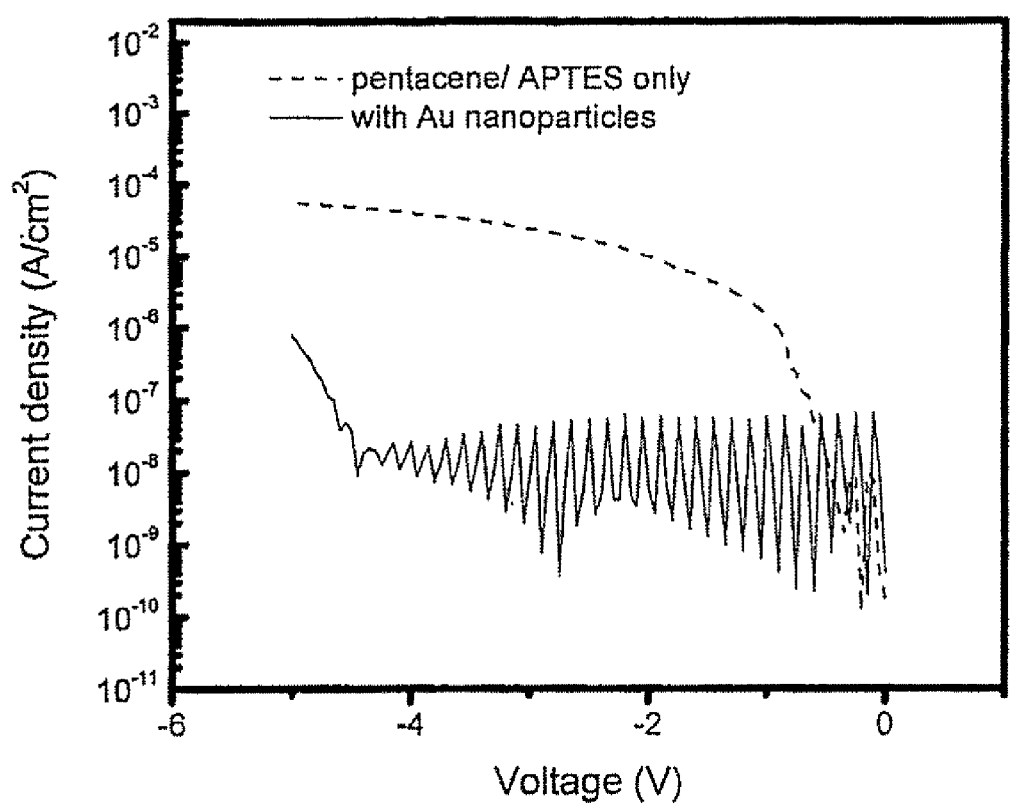
FIG. 19 is a graph of current vs voltage of a control sample of a metal/pentacene/APTES-modified substrate and with gold nano-particles.

As shown in FIG. 19, lower current through the whole device is observed for the sample with Au nanoparticles. The current obtained from the control sample (pentacene/APTES/$SiO_2$) was at least two orders of magnitude higher. This might be due to charges being stored inside the Au nanoparticles and "screens" the effective electric gate field, resulting in lower effective voltage applied and hence, lower current. During voltage sweeping from 0 to −4.5V, the applied electric field can cause charging and discharging of some Au nanoparticles, leading to the breaking or formation of some conductive paths and thus decrease or increase of current respectively.

The memory device 10 may be a non-volatile memory device that can be repeatedly written, read and erased having at least one of: low operating voltage (e.g. less than 10V), current ratio between the on and off state of at least two orders in magnitude, a low processing temperature from about 50° C. to about 225° C., and a switching speed in the range of 100 µs-100 ns.

Whilst there has been described in the foregoing description exemplary embodiments of the present invention, it will be understood by those skilled in the technology concerned that many variations in details of design, construction and/or operation may be made without departing from the present invention.

The invention claimed is:

1. An organic memory device comprising:
a first electrode,
a second electrode, and
an active layer and a self-assembled charge storage layer disposed between the first and second electrodes, the self-assembled charge storage layer comprising a film of an organic dielectric material having nanostructures and/or nano-particles of a charge-storing material, wherein each of the nanostructures and/or nano-particles are separated from each other without coating or surface modification of the nanostructures and/or nano-particles, and wherein the self-assembled charge storage layer is selected from the group consisting of: a self-assembled copolymer layer containing nanostructures and/or nano-particles that have been reduced in situ from a precursor in a copolymeric solution, and a self-assembled monolayer to which the nanostructures and/or nano-particles have affinity and on which the nanostructures and/or nano-particles are provided.

2. An organic memory device as claimed in claim 1, further comprising at least one of a control layer and a tunneling layer between the first and second electrodes; at least one of the control layer and the tunneling layer is integral with the self-assembled charge storage layer; and each of the nanostructures and/or nano-particles is electrically isolated.

3. An organic memory device as claimed in claim 1, wherein the self-assembled charge storage layer comprises two self-assembled monolayer layers, with the nanostructures and/or nano-particles being between the two layers, and wherein one of the two self-assembled monolayer layers is the control layer, and the other of the two self-assembled monolayer layers is the tunneling layer; and wherein at least one of the two self-assembled monolayer layers comprises at least one silane derivative.

4. An organic memory device as claimed in claim 1, wherein the self-assembled charge storage layer is a self-assembled copolymer selected from the group consisting of: diblock, triblock, and multiblock; and wherein the self-assembled copolymer is of a material selected from the group consisting of: vinylene-based, methacrylate-based, and polyethylene oxide-based monomers.

5. An organic memory device as claimed in claim 1, wherein the affinity is at least one selected from the group consisting of: physical, and chemical.

6. An organic memory device as claimed in claim 1, wherein the nanostructures and/or nano-particles are at least one selected from the group consisting of: metal, oxide of a metal, semiconductor, ceramic, semiconducting nano-particles, nanoclusters, nanorods, nanofibers, quantum dots, fullerene, and derivatives of fullerene; and wherein the quantum dots are selected from the group consisting of: gold, silver, copper, titanium dioxide, zinc dioxide, cadmium selenides, and cadmium sulphides.

7. An organic memory device as claimed in claim 1, wherein the organic memory device comprises a thin film transistor (TFT), the first electrode being a gate electrode of the TFT, the second electrode being one of a source electrode and a drain electrode of the TFT.

8. A method for the fabrication of an organic memory device, the method comprising:
forming a first electrode,
forming a self-assembled charge storage layer of an organic dielectric material including nanostructures and/or nano-particles without coating or modifying the surface of the nanostructures and/or nano-particles,
forming an active layer, and
forming a second electrode such that the self-assembled charge storage layer and active layer are disposed between the first and second electrodes,
wherein the self-assembled charge storage layer is formed by one of: reducing nanostructures and/or nano-particles in situ from a precursor in a copolymeric solution to form a self-assembled copolymer layer, and forming a self-assembled monolayer to which the nanostructures and/or nano-particles have affinity and on which the nanostructures and/or nano-particles are provided.

9. A method as claimed in claim 8, wherein the method further comprises providing at least one of a control layer and a tunneling layer between the first and second electrodes; and wherein at least one of the control layer and the tunneling layer is formed integrally with the self-assembled charge storage layer.

10. A method as claimed in claim 8, wherein one or more of the layers are formed by at least one selected from the group consisting of: spin-coating, screen-printing, and inkjet-printing.

11. A method as claimed in claim 8, wherein the self-assembled charge storage layer comprises two self-assembled monolayer layers, with the nanostructures and/or nano-particles being between the two layers, and wherein one of the two self-assembled monolayer layers is the control layer, and the other of the two self-assembled monolayer layers is the tunneling layer; and wherein at least one of the two self-assembled monolayer layers comprises at least one silane derivative.

12. A method as claimed in claim 8, wherein each of the nanostructures and/or nano-particles is electrically isolated; and the self-assembled copolymer is selected from the group consisting of: diblock, triblock, and multiblock; and wherein the self-assembled copolymer is of a material selected from the group consisting of: vinylene-based, methacrylate-based, and polyethylene oxide-based monomers.

13. A method as claimed in claim 8, wherein the nanostructures and/or nano-particles are at least one selected from the group consisting of: metal, oxide of a metal, semiconductor, ceramic, semiconducting nano-particles, nanoclusters, nanorods, nanofibers, quantum dots, fullerene, and derivatives of fullerene; and wherein the quantum dots are selected from the group consisting of: gold, silver, copper, titanium dioxide, zinc dioxide, cadmium selenides, and cadmium sulphides.

14. A method as claimed in claim 8, wherein the organic memory device comprises a thin film transistor (TFT), the first electrode being a gate electrode of the TFT, the second electrode being one of a source electrode and a drain electrode of the TFT.

* * * * *